(12) United States Patent
Chen et al.

(10) Patent No.: US 8,940,609 B2
(45) Date of Patent: Jan. 27, 2015

(54) MOS DEVICE AND METHOD OF MANUFACTURING THE SAME

(71) Applicant: Macronix International Co., Ltd., Hsinchu (TW)

(72) Inventors: Chien-Chung Chen, Pingtung County (TW); Ming-Tung Lee, Taoyuan County (TW); Shih-Chin Lien, Taipei County (TW); Shyi-Yuan Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 14/307,973

(22) Filed: Jun. 18, 2014

(65) Prior Publication Data

US 2014/0302654 A1    Oct. 9, 2014

Related U.S. Application Data

(62) Division of application No. 13/225,349, filed on Sep. 2, 2011, now Pat. No. 8,829,615.

(51) Int. Cl.
*H01L 29/66* (2006.01)
*H01L 21/265* (2006.01)
*H01L 29/78* (2006.01)
*H01L 29/08* (2006.01)
*H01L 29/10* (2006.01)

(52) U.S. Cl.
CPC .... *H01L 29/66492* (2013.01); *H01L 21/26586* (2013.01); *H01L 29/66659* (2013.01); *H01L 29/7835* (2013.01); *H01L 29/0847* (2013.01); *H01L 29/1045* (2013.01); *H01L 29/78* (2013.01); *H01L 21/265* (2013.01)

USPC ........... 438/286; 257/339; 257/268; 257/492; 257/342

(58) Field of Classification Search
CPC ..................... H01L 29/7835; H01L 29/66659; H01L 29/1083; H01L 29/0653; H01L 29/7816; H01L 29/0847
USPC .......... 257/262, 368–401, E29.255–E29.313, 257/E29.315–E29.316, 106, 186, 199, 257/481–482, 493, 589, 603–606, E31.063, 257/E29.18, E29.334–E29.335; 438/135, 438/151, 197, 199, 201, 207, 216
See application file for complete search history.

(56) References Cited

U.S. PATENT DOCUMENTS

| | | | |
|---|---|---|---|
| 2002/0145163 A1* | 10/2002 | Pan | 257/355 |
| 2005/0073007 A1* | 4/2005 | Chen et al. | 257/355 |
| 2005/0194647 A1* | 9/2005 | Tsai et al. | 257/377 |

* cited by examiner

*Primary Examiner* — David Vu
*Assistant Examiner* — Jonathan Han
(74) *Attorney, Agent, or Firm* — Baker & McKenzie LLP

(57) ABSTRACT

A semiconductor device and method of forming the semiconductor device are disclosed, where the semiconductor device includes additional implant regions in the source and drain areas of the device for improving Ron-sp and BVD characteristics of the device. The device includes a gate electrode formed over a channel region that separates first and second implant regions in the device substrate. The first implant region has a first conductivity type, and the second implant region has a second conductivity type. A source diffusion region is formed in the first implant region, and a drain diffusion region is formed in the second implant region.

11 Claims, 9 Drawing Sheets

MOS DEVICE AND METHOD OF MANUFACTURING THE SAME

CROSS-REFERENCE TO RELATED APPLICATION

This is a divisional application of U.S. patent application Ser. No. 13/225,349, filed Sep. 2, 2011, titled "MOS device and method of manufacturing the same," the disclosure of which is incorporated herein in its entirety by reference as if set forth in full.

BACKGROUND

1. Technical Field

The present application relates to semiconductor technology, and more particularly to Metal Oxide Semiconductor (MOS) devices and methods of making MOS devices.

2. Related Art

MOS devices such as transistors and similarly structured memory cells are known that have a configuration as shown in FIG. 1. The MOS device shown in FIG. 1 is an N-type MOS device, referred to as an NMOS device 100. The NMOS device 100 is formed on a semiconductor substrate 102, such as a silicon wafer. A P-well 104 is formed in the substrate 102, which will serve as body and active region for the NMOS device 100. The P-well 104 can be formed, for example, by known well implantation processes, such as the implantation of boron (B) ions, which introduces P-type impurities. The NMOS device 100 also includes diffusion regions 106 and 108, which can serve as the source and drain, respectively. The NMOS device 100 includes a gate structure, which includes a gate oxide layer 110 and a polysilicon gate electrode 112. The gate oxide layer 110 is typically formed by performing a thermal oxidation process on the upper surface of the substrate 102, followed by a deposition process for depositing polysilicon for the gate electrode 112. The gate oxide layer 110 and gate electrode 112 can then be formed by patterning the oxide and polysilicon layers, for example using a photolithography process. In some cases, the gate structure can be formed prior to the formation of the diffusion regions 106 and 108 so that the gate can be used to assist with alignment of the diffusion regions 106 and 108.

Next, an interlevel dielectric (ILD) structure 116 is formed for electrically isolating various structures of the NMOS device 100. Known back-end-of-line (BEOL) processes are performed, which will include fabrication of vias and conductive lines including the source interconnect line 118, drain interconnect line 120, and gate interconnect line 122.

For devices such as the NMOS device 100, simultaneous high voltage and low voltage limitations are often imposed for design objectives. These simultaneous objectives are often contradictory. For example, high voltage transistors with high junction breakdown characteristics and high punch-through characteristics are desirable for passing a relatively high voltage. However, in order to efficiently pass the high voltage from drain to source without significant voltage drop, the transistor preferrably should also have low channel resistance. These contradictory high voltage requirements can sometimes be met using long channel length transistors. However, as the technology is scaled down, shorter channels are desired, increasing the difficulty of integrating high voltage transistors such as the device 100 that have suitable on-resistance and breakdown voltage levels.

SUMMARY

A semiconductor device is presented, which in some embodiments includes a well of a first conductivity type formed in a substrate, a gate electrode formed over the well, a first implant region formed in the well and extending from below the gate electrode, a second implant region formed in the well and extending from below the gate electrode, a source diffusion region formed in the first implant region, and a drain diffusion region formed in the second implant region. The first implant region has the first conductivity type and the second implant region has a second conductivity type. The second implant region is separated from the first implant region by a channel region below the gate electrode. The source diffusion region has the second conductivity type. The drain diffusion region has the second conductivity type and a heavier doping concentration than the second implant region.

In some embodiments, the semiconductor device may also include a third implant region between the source diffusion region and the first implant region and/or a fourth implant region between the drain diffusion region and the second implant region. The third implant region may be of the same conductivity type as the source diffusion region and may have a lower doping concentration than the source diffusion region. The fourth implant region may also be of the same conductivity type as the drain diffusion region.

A method for manufacturing a semiconductor device is also presented. The method may include forming a well of a first conductivity type in a substrate, forming a gate electrode over the well, forming a first implant region in the well that extends from below the gate electrode, forming a second implant region in the well that extends from below the gate electrode, forming a source diffusion region in the first implant region, and forming a drain diffusion region having the second conductivity type. The first implant region has the first conductivity type and the second implant region has a second conductivity type. The second implant region is separated from the first implant region by a channel region below the gate electrode. The source diffusion region has the second conductivity type. The drain diffusion region has the second conductivity type and a heavier doping concentration than the second implant region.

The method may further include forming a third implant region in the first implant region and/or forming a fourth implant region in the second implant region.

BRIEF DESCRIPTION OF THE DRAWINGS

Features, aspects, and embodiments of the inventions are described in conjunction with the attached drawings, in which.

DETAILED DESCRIPTION

Figure 1:
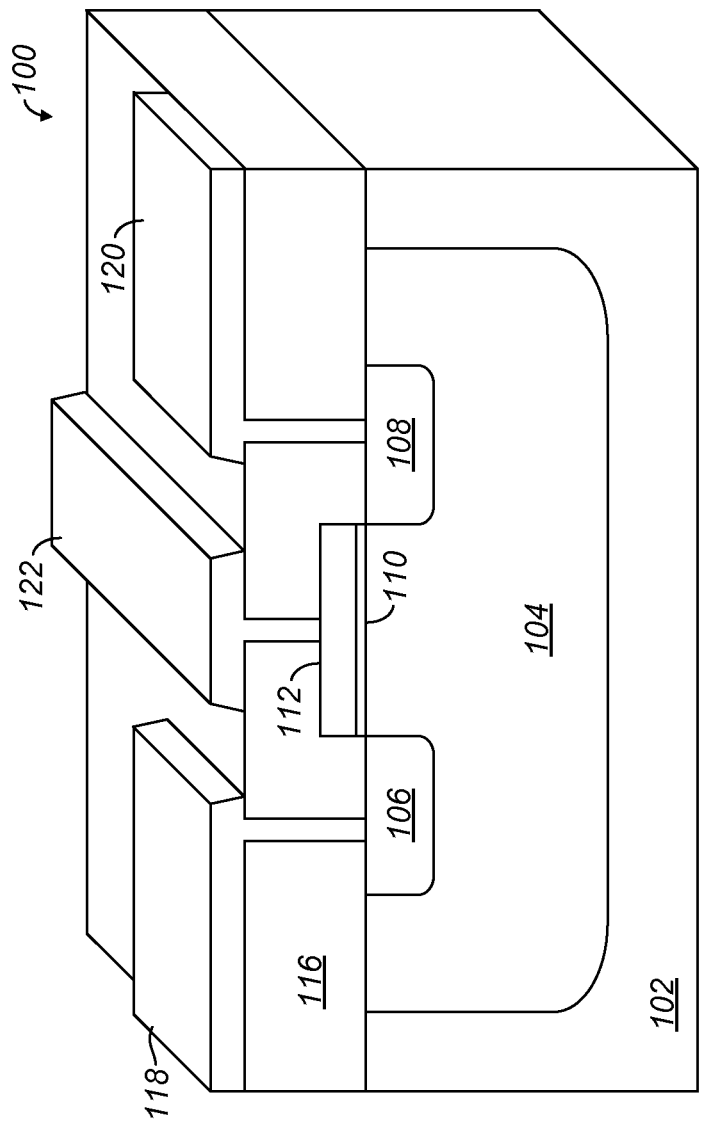
FIG. 1 shows a cross-sectional, perspective view of a conventional NMOS device.
Figure 2:
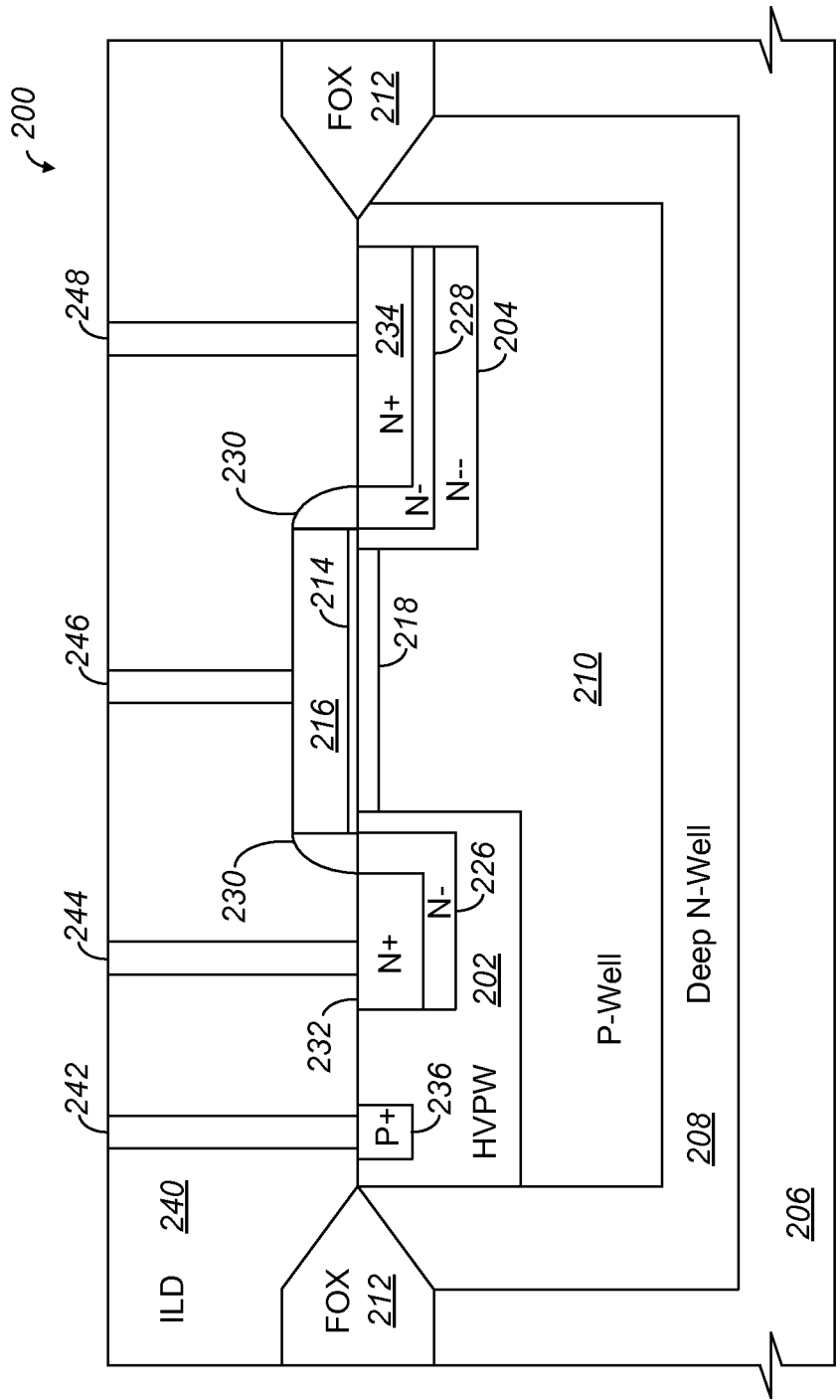
FIG. 2 shows a cross-sectional view of an NMOS device according to the present disclosure.

FIG. 2 shows a cross-sectional view of an NMOS device 200 that allows for improved break-down voltage (BVD) and specific on-resistance (Ron,sp) in a short channel device. The NMOS device 200 includes an anti-punch implant region, referred to as HVPW 202, in the vicinity of the device source. The NMOS device 200 also includes a very lightly doped region, referred to as N−− region 204, in the vicinity of the device drain. The HVPW 202 and the N−− region 204 are separated from each other by a channel region of the NMOS device that extends below the gate 216. The addition of these two regions contributes to the improved device characteristics. More specifically, the HVPW region 202 improves BVD, as well as off-state drain-to-source leakage current (Ioff). The HVPW region 202 also can allow for adjustments to the threshold voltage (Vt). The N-- region 204 improves the device Ron and the device BVD. While an NMOS device 200 is shown and described, alternative embodiments are possible. For example, those skilled in the art will appreciate that conductivity types (e.g., N-type and P-type material) can be interchanged in order to achieve a PMOS device.

Figure 3:
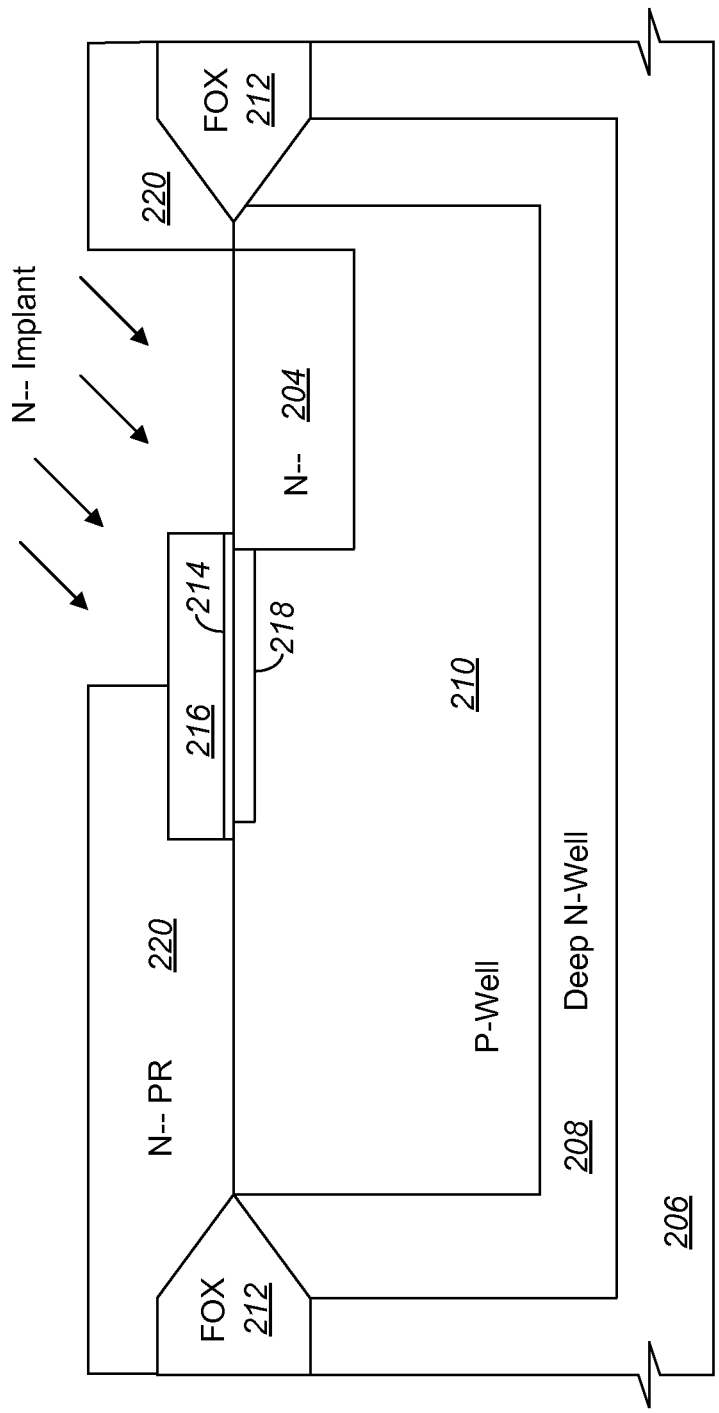
FIGS. 3-5 show respective intermediate structures that can be formed during an exemplary process for manufacturing the NMOS device shown in FIG. 2.

The NMOS device 200 will now be described in greater detail. FIG. 3 shows the NMOS device 200 at an intermediate point in the manufacturing process. The intermediate structure shown in FIG. 3 includes a semiconductor substrate 206. The semiconductor substrate 206 can be a silicon wafer or any of a variety of known semiconductor substrates.

For device isolation, the NMOS device 200 includes a deep N-well 208 formed in the semiconductor substrate 206, and then a P-well 210 formed in the deep N-well 208. The deep N-well 208 and P-well 210 can be formed using known masking and ion implantation techniques. Additional isolation structures can include field oxide (FOX) layers 212, which can be formed using known masking and thermal oxidation techniques. For example, an oxide definition (OD) nitride mask can be used to define the areas for the FOX layers 212, and then a thermal oxide process can be used to form the FOX layers 212. While variations are possible, FOX layers 212 can have a thickness that is in a range of 4000 to 7000 angstroms, preferably about 5500 angstroms.

The NMOS device 200 includes a gate oxide layer 214 disposed between a gate electrode 216 and the P-well 210. The NMOS device 200 can also include a Vt implant region 218 below the gate oxide layer 214, and extending between the HVPW region 202 and the N-- region 204. The gate oxide layer 214, gate electrode 216, and Vt implant region 218 can be formed using known processes. For example, the Vt implant can be formed using a known process that includes the use of a sacrificial oxide (SAC-OX), followed by a thermal oxidation process for forming an oxide layer over the substrate 206. Polysilicon deposition can be used to form a polysilicon layer over the oxide layer, and then the polysilicon and oxide layers can be selectively etched according to known photolithography processes to form the gate oxide layer 214 from the oxide layer and the gate electrode 216 from the polysilicon layer.

Next, the N-- region 204 is formed at the point shown in FIG. 3. Before implanting the N-- region 204, a N-- photoresist mask 220 is formed. Then, using a well implantation process, conductive impurities are implanted in the P-well 210, for example using phosphorus (P) or arsenic (As) ions, and preferably using a tilt angle in a range of 20 degrees to 60 degrees, for example about 45 degrees. Also, the gate electrode 216 also serves to partially mask the implantation process, allowing for self-alignment of the N-- region 204. After the N-- region 204 is formed, the N-- photoresist mask 220 is removed using an ashing process.

Figure 4:
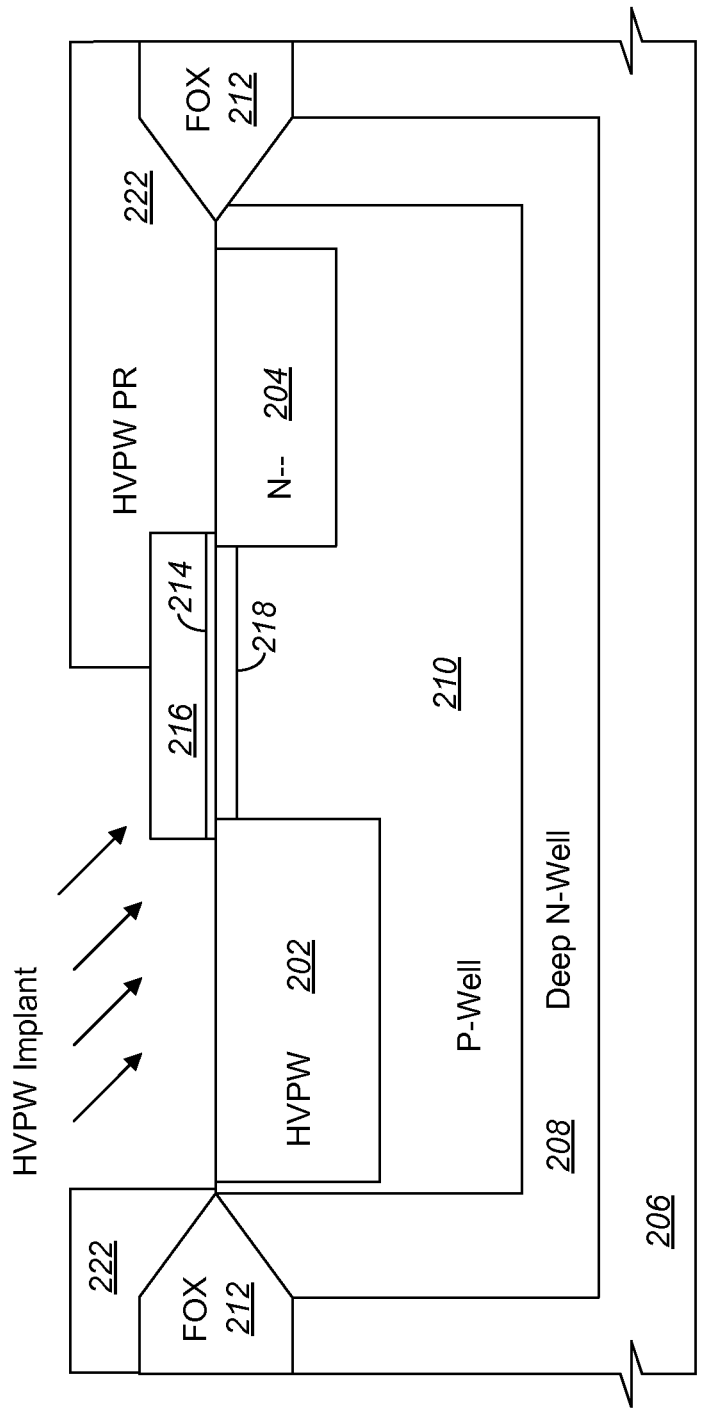

Turning next to FIG. 4, the NMOS device 200 is shown at another intermediate point in the manufacturing process. The HVPW region 202 is formed at the point shown in FIG. 4. Before implanting the HVPW region 202, an HVPW photoresist mask 222 is formed. Then, using a well implantation process, conductive impurities are implanted in the P-well 210, for example using boron (B) ions, and a tilt angle of about 7 degrees. Also, the gate electrode 216 also serves to partially mask the implantation process, allowing for self-alignment of the HVPW region 202. After the HVPW region 202 is formed, the HVPW photoresist mask 222 is removed using an ashing process.

Figure 5:
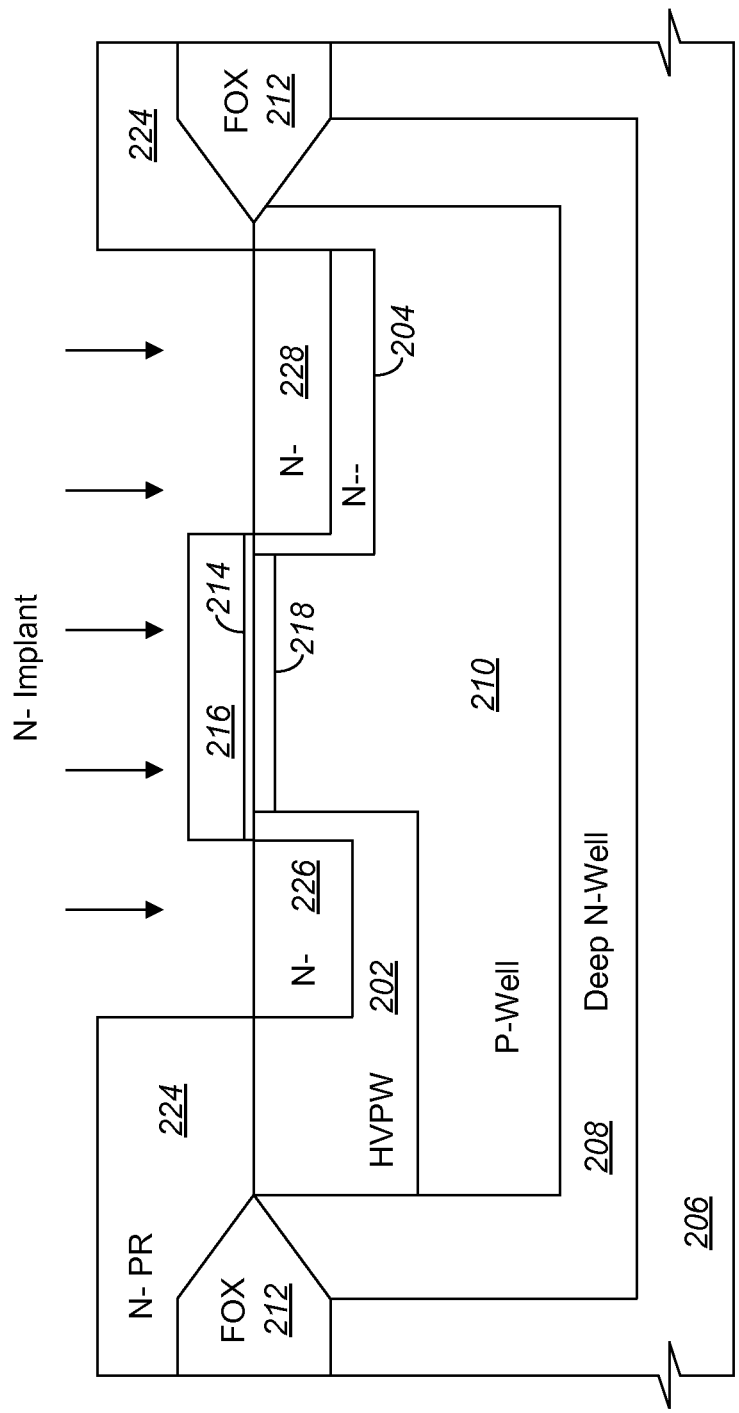

Turning next to FIG. 5, the NMOS device 200 is shown at another intermediate point in the manufacturing process. Additional anti-punch regions are formed at the point shown in FIG. 5. The additional anti-punch regions include a source-side N- region 226, and a drain-side N- region 228. Before implanting the N- regions 226 and 228, a N- photoresist mask 224 is formed. Then, using a well implantation process, conductive impurities are implanted in the P-well 210, for example using phosphorus (P) or arsenic (As) ions, and a tilt angle of about zero degrees. Also, the gate electrode 216 also serves to partially mask the implantation process, allowing for self-alignment of the N- regions 226 and 228. After the N- regions 226 and 228 are formed, the N- photoresist mask 224 is removed using an ashing process.

Referring back now to FIG. 2, the remaining structures can be formed using standard NMOS manufacturing processes. For example, spacers 230, such as tetra ethyl ortho silicate (TEOS) can be formed by deposition and etching. The spacers 230 can be used for alignment of subsequently formed source diffusion region 232 and drain diffusion region 234. Thus, after formation of the spacers 230, the N+ source diffusion region 232 and N+ drain diffusion region 234 can be formed using photolithography and well implantation processes. Similarly, the P+ body diffusion region 236 can be formed using photolithography and well implantation processes. After the diffusion regions 232, 234, and 236 have been formed, an inter layer dielectric (ILD) structure 240 can then be formed of an insulating material, such as borophosphosilicate glass (BPSG) or the like, for electrically isolating various structures of the NMOS device 200. Known back-end-of-line (BEOL) processes are then performed to complete the device 200, which can include fabrication of body via 242, source via 244, gate via 246, and drain via 248.

Those skilled in the art will appreciate that conductivity types (e.g., N-type and P-type material) can be interchanged in order to achieve a PMOS device. For example, a PMOS device can be made by changing the conductivity type of the HVPW 202, P-well 210, and P+ region 236 to N-type, and by changing the conductivity type of the N-- region 204, N- region 226, N- region 228, N+ region 232, and N+ region 234 to P-type.

Figure 6:
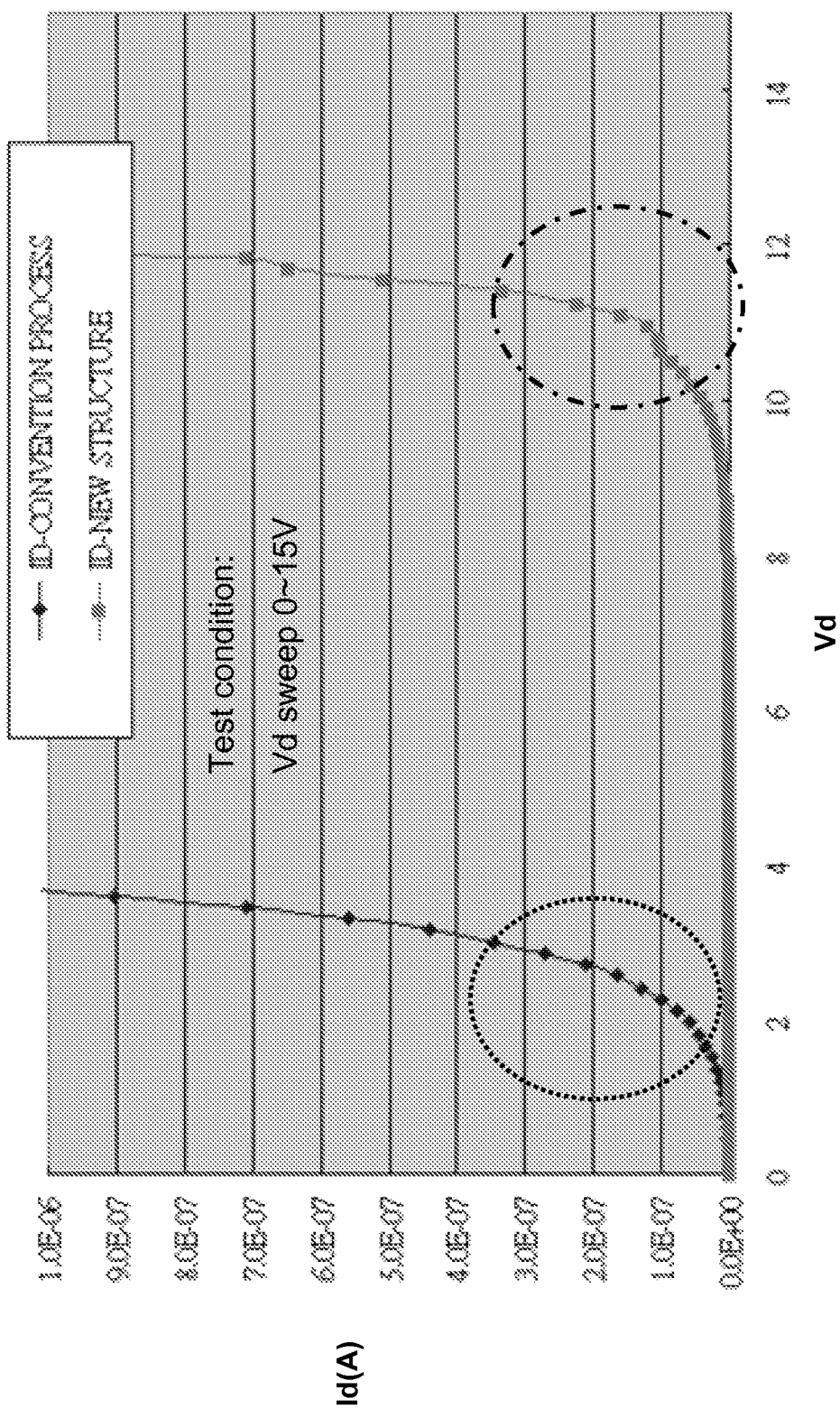
FIGS. 6-9 show charts of comparison data illustrating improvements realized by presently disclosed devices.
Figure 7:
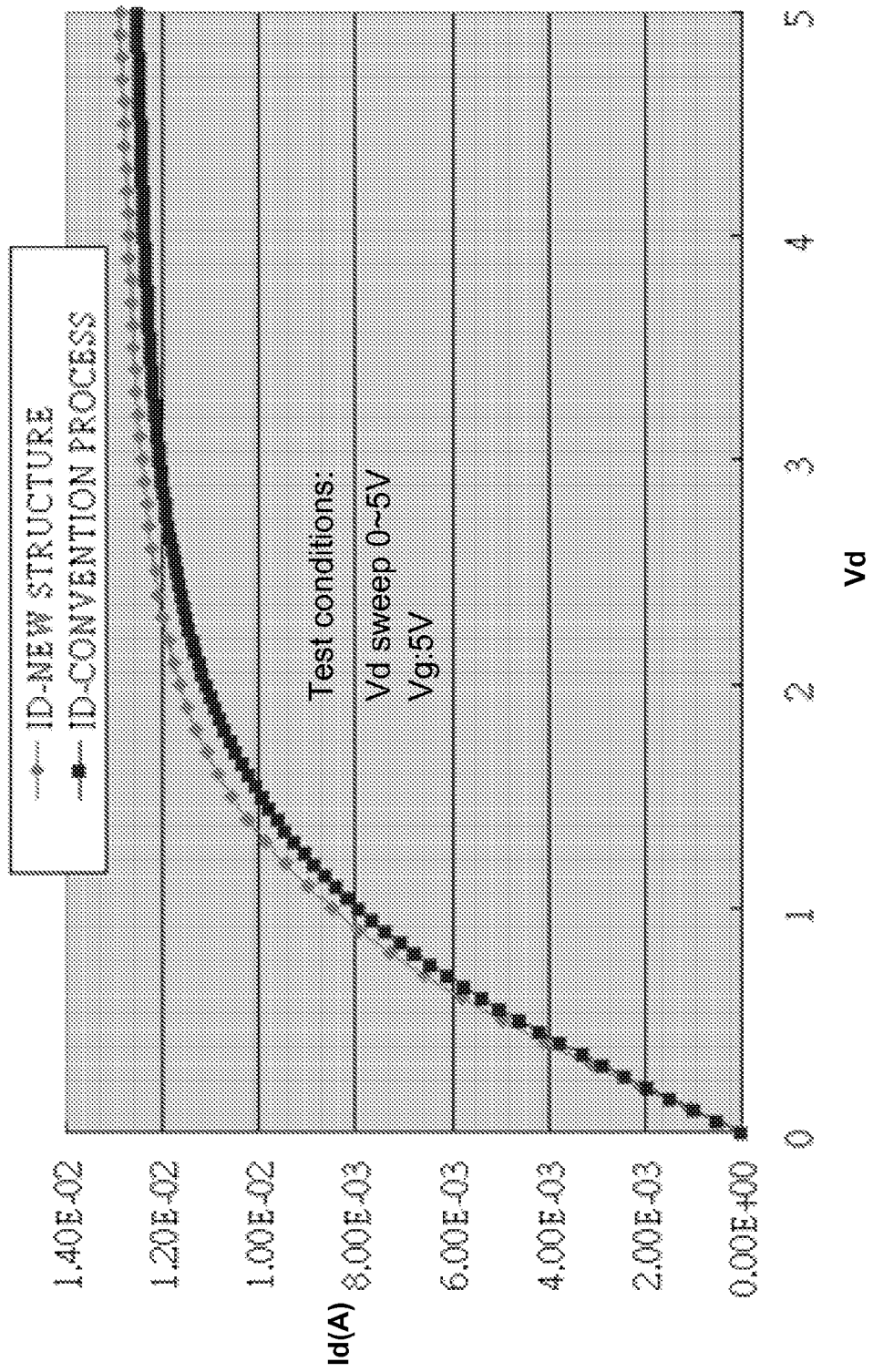
Figure 8:
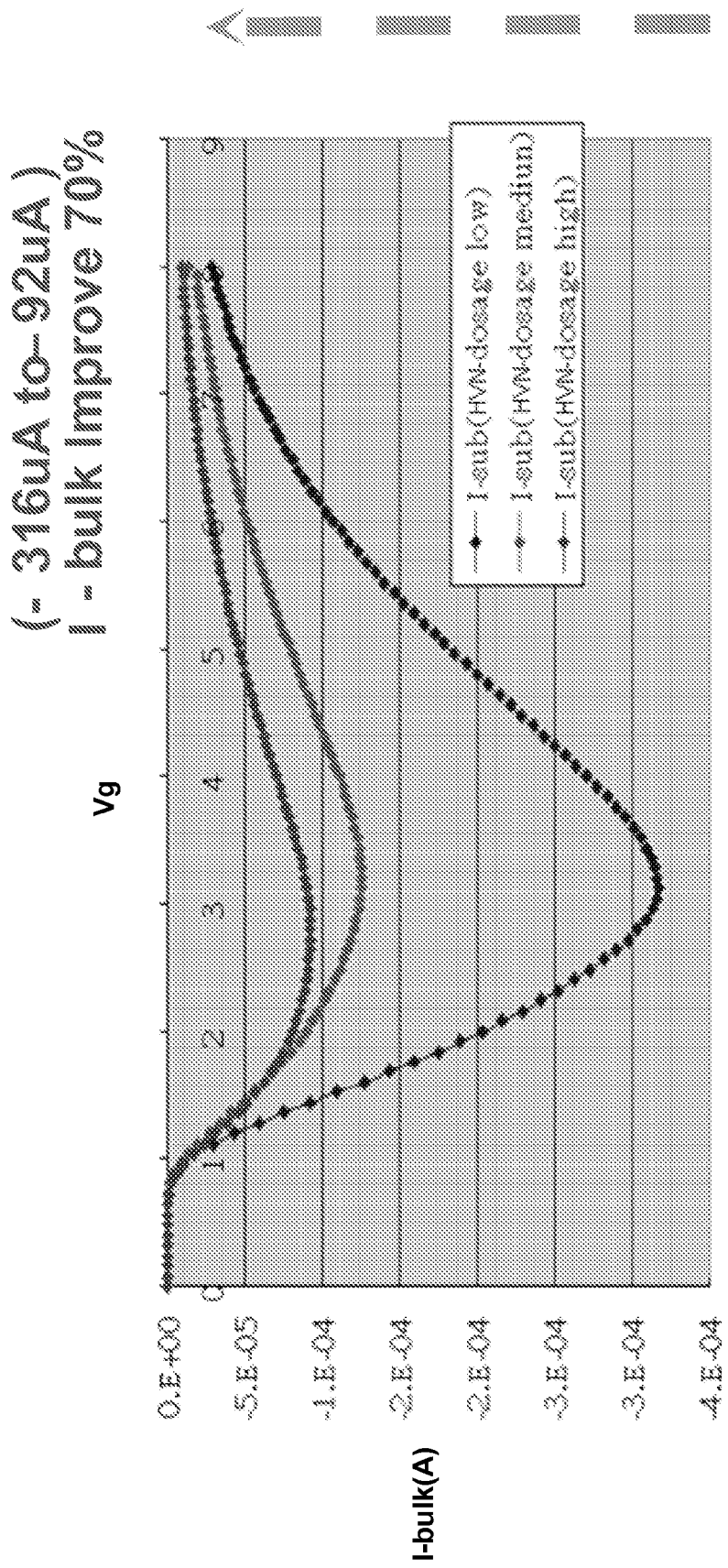
Figure 9:
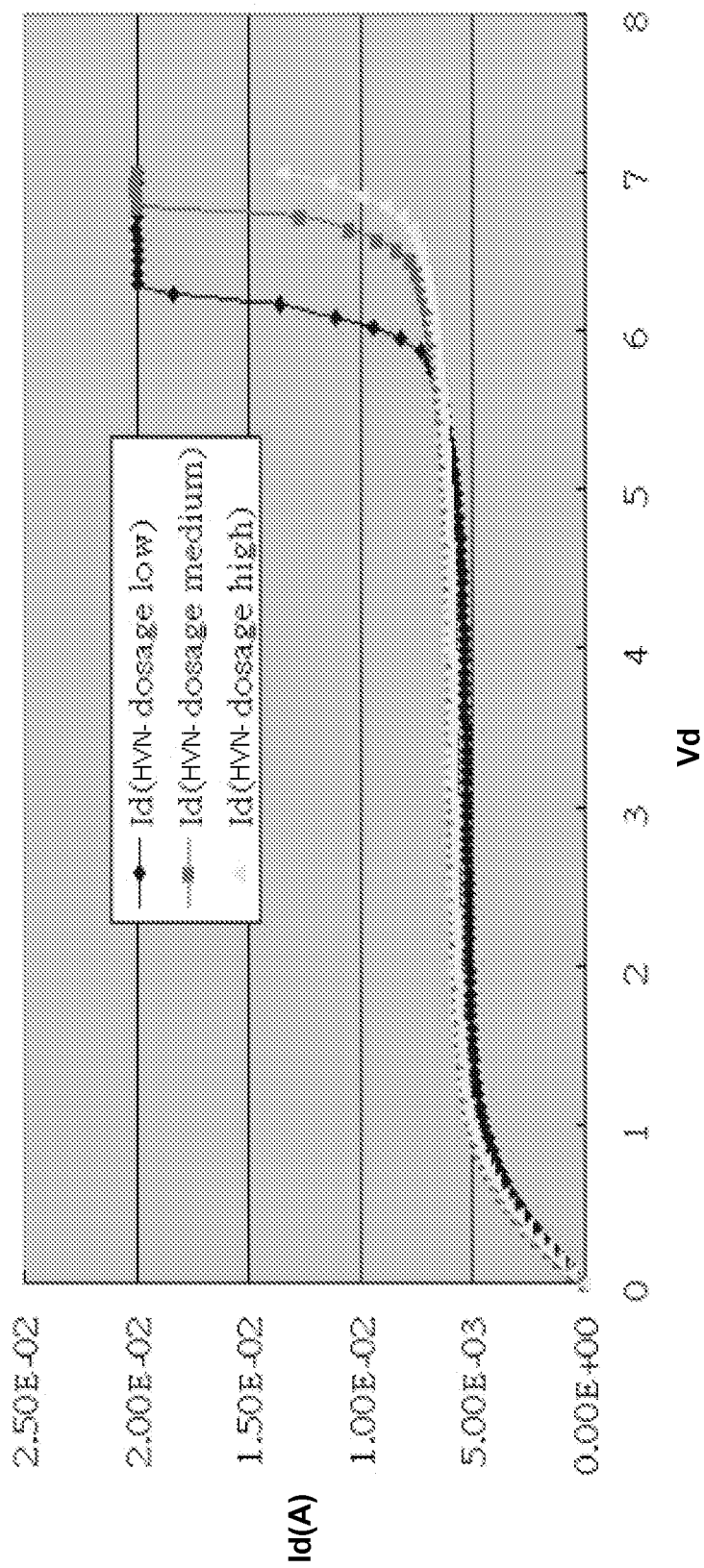

FIGS. 6-9 show charts illustrating comparison data illustrating improvements realized by presently disclosed devices. The charts shown in FIGS. 6 and 7 compare an NMOS device as shown in FIG. 2 to a prior device, both having a gate length of about 0.4 µm. In the chart shown in FIG. 6, it can be seen that the BVD is greatly improved in the present device, which breaks down at about 11 volts, compared to the prior device, which breaks down at about 3 volts. In the chart shown in FIG. 7, it can be seen that the Ron-sp is also improved in the present device compared to the prior device. For a range of drain voltages Vd, particularly in the range greater than 1 volt, the present device allows more drain current Id compared to the prior device at the same drain voltage Vd. The charts shown in FIGS. 8 and 9 show data related to implementations of the disclosed NMOS device. In FIG. 8, it can be seen that implementations of the disclosed NMOS device can achieve improved bulk current (I-bulk) resulting from hot carrier effects by about 70% (in a range of −316 µA to −92 µA depending on the dosage) compared to prior devices. In FIG. 9, it can be seen that implementations of the disclosed NMOS device can achieve improved on-BVD. As shown in FIG. 9, the on-BVD can be improved by about 13.3% (in a range of 6V to 6.8V depending on the dosage) compared to prior devices.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A method of manufacturing a semiconductor device comprising:
    forming a well of a first conductivity type formed in a substrate;
    forming a gate electrode over the well;
    forming a first implant region in the well that extends from below the gate electrode, the first implant region having the first conductivity type;
    forming a second implant region in the well that extends from below the gate electrode, the second implant region having a second conductivity type, and the second implant region being separated from the first implant region by a channel region formed adjacent to the second implant region and below the gate electrode;
    forming a source diffusion region in the first implant region, the source diffusion region having the second conductivity type; and
    forming a drain diffusion region in the second implant region, the drain diffusion region having the second conductivity type and having a heavier doping concentration than the second implant region.

2. The method of claim 1, further comprising forming a third implant region in the first implant region, wherein the forming of the source diffusion region includes forming the source diffusion region such that the third implant region is between the source diffusion region and the first implant region.

3. The method of claim 2, wherein the third implant region is of the same conductivity type as the source diffusion region.

4. The method of claim 3, wherein the third implant region has a lower doping concentration than the source diffusion region.

5. The method of claim 1, further comprising forming a fourth implant region in the second implant region, wherein the forming of the drain diffusion region includes forming the drain diffusion region such that the fourth implant region is between the drain diffusion region and the second implant region.

6. The method of claim 5, wherein the fourth implant region is of the same conductivity type as the drain diffusion region.

7. The method of claim 6, wherein the fourth implant region has a lower doping concentration than the source diffusion region.

8. The method of claim 7, wherein the fourth implant region has a higher doping concentration than the second implant region.

9. The method of claim 1, wherein the second implant region has a lower doping concentration than the drain diffusion region.

10. The method of claim 1, wherein the first conductivity type is P-type, and the second conductivity type is N-type.

11. The method of claim 1, wherein the first conductivity type is N-type, and the second conductivity type is P-type.

* * * * *